United States Patent [19]

Kasper et al.

[11] 3,978,510
[45] Aug. 31, 1976

[54] HETEROJUNCTION PHOTOVOLTAIC DEVICES EMPLOYING I-III-VI COMPOUNDS

[75] Inventors: Horst Manfred Kasper, Warren; Piero Migliorato, Matawan; Joseph Leo Shay, Marlboro; Sigurd Wagner, Holmdel, all of N.J.

[73] Assignee: Bell Telephone Laboratories, Incorporated, Murray Hill, N.J.

[22] Filed: July 29, 1974

[21] Appl. No.: 492,394

[52] U.S. Cl. .................. 357/30; 357/16; 357/61
[51] Int. Cl.² ................................. H01L 27/14
[58] Field of Search .............. 357/16, 17, 30, 61

[56] References Cited
UNITED STATES PATENTS 3,767,471  10/1973  Kasper et al. .................. 148/1.5

Primary Examiner—Martin H. Edlow
Attorney, Agent, or Firm—Wilford L. Wisner

[57] ABSTRACT

Photovoltaic devices are constructed from a principal body of copper indium selenide ($CuInSe_2$) upon which is deposited a hetero-epitaxial layer of a high bandgap semiconductor, such as an n-type layer of cadmium sulfide (CdS). When made with a high-resistance intermediate region, the device is a photovoltaic detector for modulated radiation and has a response time as low as 5 nsec for a reverse bias of approximately two to three volts. When made without a high-resistance intermediate region (e.g., an abrupt p-n heterojunction) the device is a useful solar cell. In these forms of the device, absolute photovoltaic quantum efficiencies up to 70 percent have been observed. The quantum efficiency of the solar cell type of device is reasonably flat between 0.55 and 1.25 μm. With forward bias, the device is a light-emitting diode with external electroluminescent quantum efficiency of $\sim 1 \times 10^{-4}$ at room temperature and $\sim 1 \times 10^{-2}$ at 77°K, liquid nitrogen temperature.

8 Claims, 5 Drawing Figures

HETEROJUNCTION PHOTOVOLTAIC DEVICES EMPLOYING I-III-VI COMPOUNDS

BACKGROUND OF THE INVENTION

This invention relates to heterojunction devices, particularly those of the photovoltaic type useful in both absorption and emission modes of operation.

Research on semiconductor devices at optical wavelengths has indicated needs both for more efficient broadband detectors and for light-emitting diodes operating at wavelengths as yet not achieved with existing devices.

Moreover, the new awareness by research organizations of the opportunities presented by the so-called energy crisis for more modes of power conversion has stimulated a search for new solar cells.

SUMMARY OF THE INVENTION

Our invention is based on our discovery of both infrared and visible photovoltaic absorption and infrared emission in p-n heterojunction devices. A principal p-type body of the heterojunction device is a I-III-VI semiconductor such as copper indium selenide (CuInSe$_2$) and deposited thereon is an n-type hetero-epitaxial layer of another semiconductor, such as CdS, having a substantially larger bandgap than the p-type semiconductor, and a lattice substantially matched to the lattice of the p-type semiconductor. It is within the scope of our invention that the lattice match can be improved by adding a small portion, approximately 10%, ZnS to the CdS.

More specifically, we have discovered CuInSe$_2$/CdS p-n heterojunctions with uniform quantum efficiencies that reach 70 percent in the visible and near infrared.

Moreover, according to one species of our invention in which the device is provided with an abrupt p-n heterojunction, the quantum efficiency is flat and about 70 percent between about 0.55 and 1.25 $\mu$m. The species is promising for use as a solar cell.

In another species of our invention having an intermediate high-resistance region, effective detection of modulated infrared radiation has been obtained. The reverse voltage required for optimum operation is only about three volts.

In still another species of our invention, the device is forward-biased to emit infrared radiation.

Advantageously, it has been found that, in general, substrate orientation is non-critical. This fact makes the device attractive for large scale fabrication. This advantage is particularly important for solar cell fabrication.

BRIEF DESCRIPTION OF THE DRAWING

Further features and advantages of our invention will become apparent from the following detailed description taken together with the drawing, in which.

DETAILED DESCRIPTION

Figure 1:
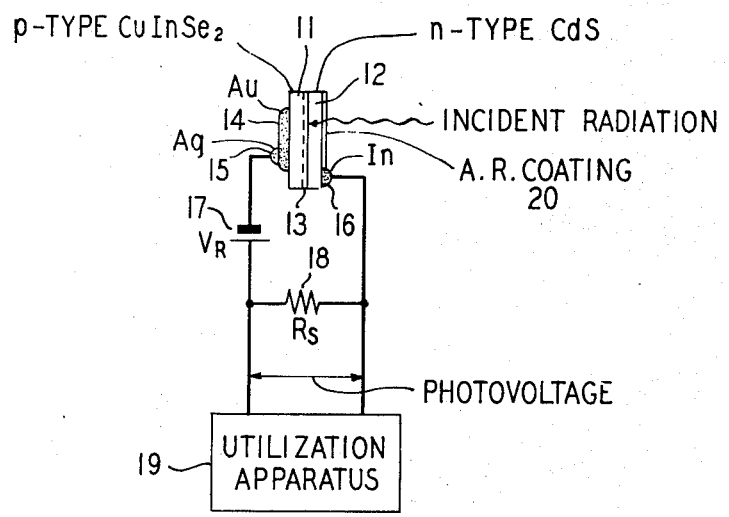
FIG. 1 is a partially schematic and partially diagrammatic illustration of a photovoltaic detector or solar cell according to our invention.

In FIG. 1 there is shown a photovoltaic device of the type appropriate for use either as a broad band detector for spectroscopy in the visible and infrared portions of the spectrum or as a solar cell. Related uses include use as a detector for evaluating glass fibers and ultimate use as a detector of modulated radiation in optical communication systems.

The device of FIG. 1 illustratively includes a principal body 11 of p-type CuInSe$_2$ and an n-type layer 12 of CdS. In this specific embodiment, the body 11 includes a high resistivity region 13 adjacent layer 12. Typically, the region 13 results from a limited addition of donor vacancies to body 11 by annealing at low temperatures in a vacuum, as set forth hereinafter.

Electrical contact is made to body 11 through a gold film 14 upon which is superimposed a silver contact 15. Electrical contact to the n-type layer 12 is achieved by the indium contact 16.

Reverse bias, illustratively two to three volts, is applied between contacts 15 and 16 by the battery 17 which is connected in series with resistor 18 between the two contacts. The negative terminal of battery 17 is oriented to be electrically nearer the p-type body 11 than is the positive terminal. The photovoltaic output voltage is developed across resistor 18 and is applied to the utilization apparatus 19. Of course, for operation as a solar cell, no battery is included in the circuit of FIG. 1. For optimum performance as a solar cell, an antireflection coating 20 is deposited into the backface of region 12 through which the radiation is to propagate.

CuInSe$_2$ crystals, such as the body 11, are prepared by melt growth as explaind in the article by J. L. Shay et al, *Physical Review*, Vol. B7, page 4485 (1973) from stoichiometric mixtures of the elements. The melting point is found to be 980°C. Individual substrate bodies 11 are cut from a boule, polished and etched in aqua regia. P-type conductivity is introduced by a 24 hr anneal at 600°C in a selenium atmosphere. Further details on this may be found in the article by B. Tell et al, *Journal of Applied Physics*, Vol. 43, page 2469 (1972), or in U.S. Pat. No. 3,767,471, H. M. Kasper et al, issued October 23, 1973.

Figure 2:
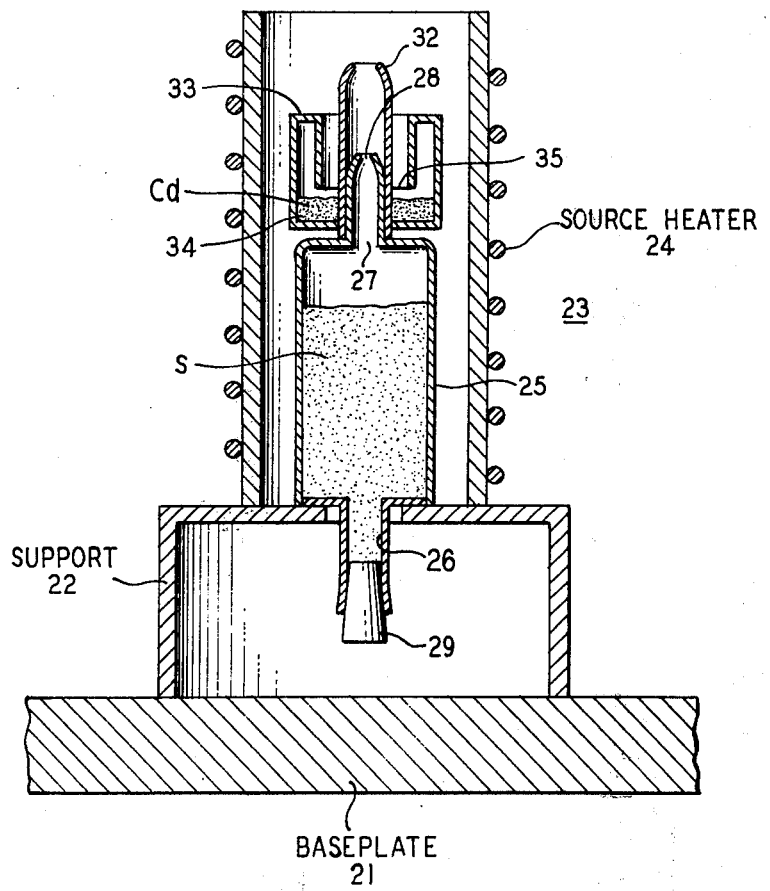
FIG. 2 is a pictorial sectional elevation of the furnace and related apparatus for growing crystalline semiconductor films.

The annealed substrates are Syton polished, cleaned in warm methanol and mounted in a vacuum station containing the apparatus for cadmium sulfide deposition as shown in FIG. 2.

The apparatus of FIG. 2 includes the base plate 21, the support 22, the furnace 23 including the source heater 24, and inside of furnace 23 the fused quartz ampoule 25 containing high purity sulphur and a narrow base portion 26 which penetrates support 22. The narrow portion 26 is sealed with a ground glass stopper 29. The ampoule 25 has an upper neck 27 with a constricted opening 28 through which sulphur vapor can pass toward the CuInSe$_2$ substrate 31. Around the neck 27 is mounted a fused quartz collar 32 attached to an additional ampoule 33 which is involuted adjacent to the constricted collar 32 to provide its opening in a recessed fashion next to the collar 32. Ampoule 33 includes high purity cadmium metal 34 extending to a point just below the involuted opening 35. In the upper end of furnace 23 a shutter 36 is provided and maintained closed until it is desired to expose substrate 31 to the cadmium and sulphur vapors. The top plate 37 for the apparatus includes heaters 38 to control the temperature of substrate 31 and a temperature-sensing thermocouple 39 to indicate that temperature. The rate of growth of cadmium sulfide upon substrate 31 can thereby be predicted and controlled. This apparatus in FIG. 2 is a modification of earlier apparatus developed by D. Beecham [Rev. Sci. Instrum. 41, 1654 (1970)] and S. Wagner et al. [Applied Physics Letters 22, 351 (1973); J. Applied Physics 45, 246 (1974)].

Prior to the CdS growth process the system is evacuated to less than $1\times10^{-5}$ Torr with conventional vacuum-establishing apparatus, such as with oil-free Vacsorb and Vacion pumps. The substrate temperature of substrate 31 is then raised by heaters 38 to the growth temperature between 130° and 210°C, while the furnace 23 is heated to 350°C by source heater 24. The annealing to provide a region 13 is achieved by maintaining the substrate at the growth temperature for ~1 hour before depositing the CdS layer.

Shutter 36 is now opened and CdS grows on the CuInSe$_2$ substrate 31 at a rate of ~0.15 $\mu$m/min. One $\mu$m equals 1 micrometer. After a CdS layer (not shown) 5 to 10 $\mu$m thick is grown, which layer will be like layer 12 of FIG. 1, the shutter 36 is closed; and the source and substrate heaters 24 and 38 are turned off and the grown device allowed to cool in vacuum to room temperature. If the lattice match is to be improved by the addition of ZnS, before the start of the CdS growth process, above, the source metal 34 is replaced in the furnace with an alloy of zinc and cadmium.

The operation and electrical properties of the device of FIG. 1 have been measured by inserting contact 16 which was soldered to layer 12, and the gold contact 14 which was deposited from an aqueous gold chloride (AuCl$_3$) solution. Silver contact 15 is air-dried silver paint. Preliminary devices had forward resistance of ~30$\Omega$ for forward voltages $\gtrsim$0.5 V, and reverse resistance of ~5 M$\Omega$ for junction areas of approximately $1\times10^{-2}$ cm$^2$. With revers bias applied, as shown in FIG. 1, the junction capacitance of some diodes measured at 1 MHz was independent of voltage within 10% for voltages of up to ~3 V. The magnitude of the capacitance was ~10 pF, which best corresponds to an insulating region ~10 $\mu$ thick. Such a region 13 is appropriate for a relatively high speed detector for high-frequency modulated radiation. Response times as small as 5 nanoseconds have been measured in such instances. It is expected that further development will lead to devices having much shorter response times on the order of 0.1 nanoseconds.

Other diodes have thinner regions 13 or an abrupt junction, as desired for a solar cell. In the latter case, a normal relationship, for which the reciprocal of the square of the capacitance is proportional to the applied voltage is observed. This capacitance-voltage relationship corresponds to an acceptor concentration ~$1\times10^{16}$ cm$^{-3}$ in $p$-type region 11. The thickness of the insulating region 13 increases for increasing anneal duration prior to CdS growth and increasing substrate temperature during CdS growth and decreases for increasing acceptor concentration present in substrate 11 prior to growth. Of course, the inverse variation was also obtained.

The diodes without the high resistivity regions 13 are advantageous for use as solar cells.

Figure 3:
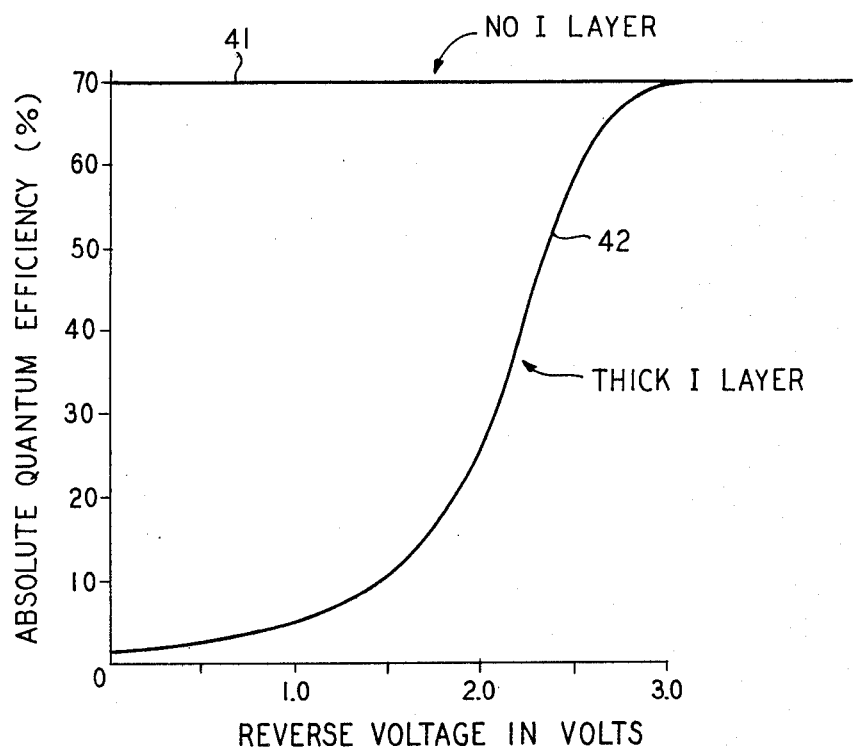
FIG. 3 shows curves useful in explaining the operation of the various embodiments of our invention.

The absolute photovoltaic response of devices such as those used in FIG. 1 was measured for light incident through the CdS layer 12, which serves as a window. Varying responses are obtained by varying device properties and the reverse voltage bias, as illustrated by the two curves 41 and 42 of FIG. 3. These curves bracket the range of performance obtainable for the device of FIG. 1, without and with the region 13, respectively. The response indicated by curve 41 is explained as follows. The parameter along the vertical coordinate, the ordinate, is absolute quantum efficiency in percent and the horizontal coordinate, the abscissa, is reverse voltage in volts. It is seen that the response shown by curve 41 for a relatively negligible region 13 is a uniform 70% quantum efficiency between 0.55 $\mu$ and 1.25 $\mu$ (see also FIG. 4) and is flat for voltages between approximately 0 volts and 3 volts. Such devices with small or nonexistent high resistivity or insulating regions are most advantageous for power production, that is, for solar cells.

The other limit of the response characteristic which we have observed is for a device having a thick high resistivity layer 13 ~10 $\mu$ thick. As shown by curve 42, in this case, the absolute quantum efficiency for a wavelength of 1.15$\mu$m does not approach a 70% level until the reverse voltage approaches three volts. As shown by curve 42, it is believed that three volts reverse voltage is the ultimum operating bias for the latter type of device.

Figure 4:
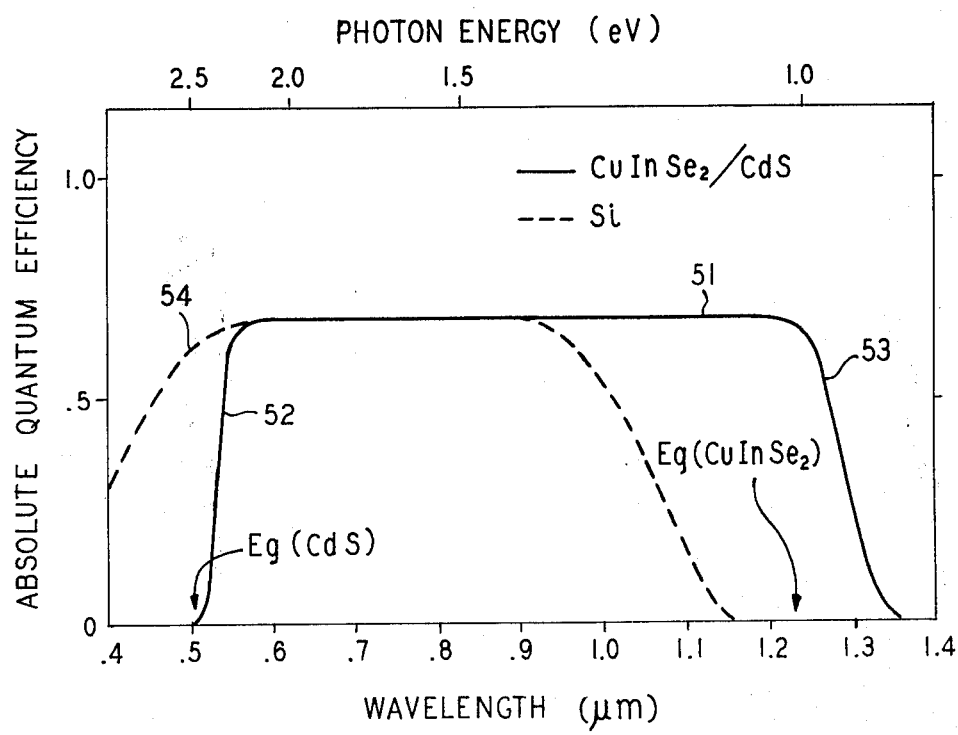
FIG. 4 shows curves comparing the detection performance of our devices with that of a silicon photodetector.

In all cases, the short wavelength cutoff of the photovoltaic device results from absorption by the CdS layer 12 which is illustrated in FIG. 4 by portion 52 of curve 51. This absorption occurs at about ~0.52 $\mu$m which is the bandgap wavelength corresponding to the bandgap energy of CdS. The long wavelength falloff of the quantum efficiency of these devices as shown by portion 53 of curve 51 in FIG. 4, results from inadequate absorption by the CuInSe$_2$ substrate. This falloff commences at the approximate bandgap wavelength of the ternary substrate, which is shown as 1.23 $\mu$m on the lower abscissa markings of FIG. 4 or at a photon energy of level as shown by the horizontal labelings at the top of FIG. 4, and continues to longer wavelengths.

We also show for comparison in FIG. 4 the quantum efficiency of prior art silicon photovoltaic detectors. The response curve 54 shown dotted in FIG. 4 shows the response of silicon photo detectors. While the silicon photo detector is superior in the blue and green regions of the spectrum, devices according to our invention clearly are superior, even at the present early stages of development, in the 1.0 to 1.3 $\mu$m region.

The broadband spectral response also indicates that such devices may ultimately be viable solar energy converters, that is solar cells. Our present devices which have non-existent insulating region 13 have solar efficiencies of ~3%.

With reference to communication detection applications of the invention, it should be observed that the quantum efficiency of devices with an appropriate insulating region 13 is reduced near zero reverse bias by an amount which depends on the wavelength and which could be shown by an additional family of curves. This is the tradeoff necessary to achieve the faster response speed of the device having the high-resistivity or insulating regions. We believe that the reduction in quantum efficiency for the better detector for modulated radiation results from an interplay by the sweep out of photo-excited carriers by the junction electric field and the penetration depth of incident radiation. However, we do not wish to be limited by this explanation of our photovoltaic detector diodes.

The high quantum efficiencies observed independent of bias in diodes without a region 13 imply that there is no interfacial "spike" in either the conduction or valence bands. Hence, the electron affinity of $CuInSe_2$ is less than that of CdS.

The speed of our fastest detector diodes has been measured using a commercially available pulsed neon laser. Decay times between 5 nsec and 150 nsec have been observed. The fastest response of 5 nsec was observed for a heavily $p$-type substrate 11 having $\sim 1 \times 10^{18}$ effective charge carriers per cubic centimeter. The substrate had been held at $\sim 175°C$ during growth.

Figure 5:
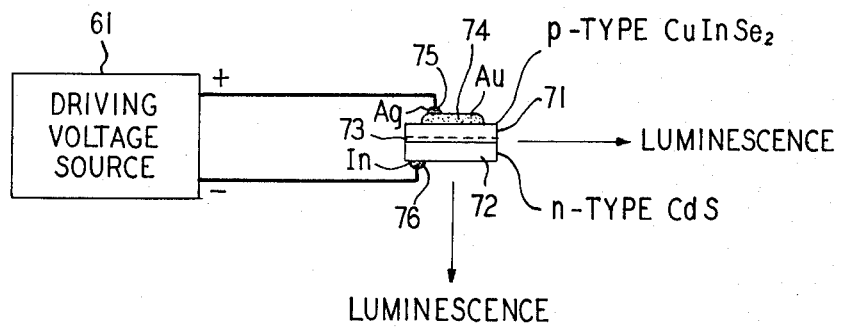
FIG. 5 is a partially schematic and partially diagrammatic illustration of a light-emitting diode according to our invention.

Referring now to FIG. 5, we see that the heterojunction diode according to our invention can be used as a light-emitting diode by driving it from an appropriate driving voltage source 61. The $p$-type $CuInSe_2$ 71 is similar to body 11 of FIG. 1 and layer 72 of $n$-type CdS corresponds to layer 12 of FIG. 1. The contacts 74, 75 and 76 are identical to contacts 14, 15 and 16 of FIG. 1. Optionally, the light-emitting diode may have the high resistivity region 73 like region 13 of FIG. 1.

Under a forward bias of $\sim 2$ volts, a heterojunction having a high resistivity region 73 electroluminesces with external quantum efficiencies of $\sim 1 \times 10^{-4}$ at room temperature and $\sim 1 \times 10^{-2}$ at 77°K, which is liquid nitrogen temperature. The emission spectrum peaks near $1.4 \mu m$ somewhat below the bandgap of $CuInSe_2$.

What is claimed is:

1. A photovoltaic device of the type comprising a $p$-type crystalline body of a I-III-VI semiconductor, and means for coupling photovoltaically to said body, characterized in that said body comprises copper indium selenide $CuInSe_2$, and the coupling means is disposed on said body and comprises an $n$-type hetero-epitaxial layer including cadmium sulfide CdS semiconductor.

2. A photovoltaic device according to claim 1 in which the n-type layer also includes ZnS.

3. A photovoltaic device according to claim 1 in which the coupling means includes an intermediate body of semiconductor between said $p$-type body and said $n$-type layer, said intermediate body having higher resistivity than said $p$-type body or said $n$-type layer, and means for applying a reverse voltage across said $p$-type body and said $n$-type layer to establish a depletion region across said intermediate body, whereby photovoltaic detection of modulated radiation passing through said layer to said bodies is facilitated.

4. A photovoltaic device according to claim 1 in which the coupling means comprises a relatively abrupt junction between said $p$-type and $n$-type layer, and electrode means for contacting said body and said layer to couple out the voltaic response while admitting a broadband solar-radiation type input wave over the major portion of the surface of the layer opposite said junction.

5. A photovoltaic device according to claim 1 in which the coupling means includes means for applying a forward bias across the $p$-type body and $n$-type layer to produce electroluminescence.

6. A detector for optical radiation of the type comprising of a I-III-VI $p$-type semiconductive body, and means for coupling photovoltaically to said body, characterized in that the $p$-type semiconductive body includes $CuInSe_2$ having a high resistivity region on one surface thereon, and in that the coupling means comprises an $n$-type epitaxial layer of CdS deposited on said one surface of said body.

7. The detector according to claim 6 in which the major portion of the $p$-type body has an effective charge concentration of $\sim 1 \times 10^{18}$ per cubic centimeter.

8. A solar cell comprising a body of I-III-VI $p$-type $CuInSe_2$ and an $n$-type epitaxial layer of CdS forming a heterojunction with said body, and means for coupling a photovoltaic output from said body while admitting solar radiation through most of said CdS layer.

* * * * *